US008524606B2

(12) United States Patent
Charns et al.

(10) Patent No.: US 8,524,606 B2
(45) Date of Patent: Sep. 3, 2013

(54) CHEMICAL MECHANICAL PLANARIZATION WITH OVERBURDEN MASK

(75) Inventors: Leslie Charns, San Jose, CA (US); John M. Cotte, New Fairfield, CT (US); Jason E. Cummings, Smithfield, NC (US); Lukasz J. Hupka, Cronton-On-Hudson, NY (US); Dinesh R. Koli, Tarrytown, NY (US); Tomohisa Konno, Mie (JP); Mahadevaiyer Krishnan, Hopewell Junction, NY (US); Michael F. Lofaro, Danbury, CT (US); Jakub W. Nalaskowski, Yorktown Heights, NY (US); Masahiro Noda, Mie (JP); Dinesh K. Penigalapati, Tarrytown, NY (US); Tatsuya Yamanaka, Mie (JP)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 264 days.

(21) Appl. No.: 13/012,821

(22) Filed: Jan. 25, 2011

(65) Prior Publication Data
US 2012/0083125 A1  Apr. 5, 2012

Related U.S. Application Data

(60) Provisional application No. 61/389,546, filed on Oct. 4, 2010.

(51) Int. Cl.
*H01L 21/311* (2006.01)
(52) U.S. Cl.
USPC ............. 438/697; 438/690; 438/692; 216/37; 216/67

(58) Field of Classification Search
USPC ...................... 216/37, 67; 438/690, 692, 697
See application file for complete search history.

(56) References Cited

U.S. PATENT DOCUMENTS 4,954,459 A   9/1990   Avanzino et al.
4,962,064 A   10/1990  Haskell et al.
(Continued)

FOREIGN PATENT DOCUMENTS

EP      0853335 A2      7/1998
KR      20030013146 A   2/2003
(Continued)

OTHER PUBLICATIONS

America, W., et al. "Slurry Additive Effects on the Suppression of Silicon Nitride Removal During CMP" Electrochemical and Solid-State Letters, vol. 7, Issue 12. Nov. 2004. pp. 327-330.

(Continued)

*Primary Examiner* — Lan Vinh
*Assistant Examiner* — Maki Angadi
(74) *Attorney, Agent, or Firm* — Tutunjian & Bitetto, P.C.; Catherine Ivers

(57) ABSTRACT

Planarization methods include depositing a mask material on top of an overburden layer on a semiconductor wafer. The mask material is planarized to remove the mask material from up areas of the overburden layer to expose the overburden layer without removing the mask material from down areas. The exposed overburden layer is wet etched and leaves a thickness remaining over an underlying layer. Remaining portions of the mask layer and the exposed portions of the overburden layer are planarized to expose the underlying layer.

25 Claims, 4 Drawing Sheets

(56) References Cited

U.S. PATENT DOCUMENTS

| | | | |
|---|---|---|---|
| 5,173,439 A | 12/1992 | Dash et al. | |
| 5,675,587 A * | 10/1997 | Okuyama et al. | 714/712 |
| 5,676,587 A * | 10/1997 | Landers et al. | 451/57 |
| 5,712,185 A | 1/1998 | Tsai et al. | |
| 5,736,462 A | 4/1998 | Takahashi et al. | |
| 5,738,800 A | 4/1998 | Hosali et al. | |
| 5,759,917 A | 6/1998 | Grover et al. | |
| 5,938,505 A | 8/1999 | Morrison et al. | |
| 5,961,794 A | 10/1999 | Morita | |
| 6,015,755 A | 1/2000 | Chen et al. | |
| 6,114,249 A | 9/2000 | Canaperi et al. | |
| 6,117,748 A | 9/2000 | Lou et al. | |
| 6,319,836 B1 | 11/2001 | Dunton et al. | |
| 6,361,402 B1 | 3/2002 | Canaperi et al. | |
| 6,491,843 B1 | 12/2002 | Srinivasan et al. | |
| 6,544,892 B2 | 4/2003 | Srinivasan et al. | |
| 6,580,137 B2 | 6/2003 | Parke | |
| 6,616,514 B1 | 9/2003 | Edelbach et al. | |
| 6,617,251 B1 | 9/2003 | Kamath et al. | |
| 6,743,683 B2 | 6/2004 | Barns et al. | |
| 6,746,316 B2 | 6/2004 | Chopra et al. | |
| 6,756,643 B1 | 6/2004 | Achuthan et al. | |
| 6,812,076 B1 | 11/2004 | Achuthan et al. | |
| 6,824,579 B2 | 11/2004 | Ronay | |
| 6,855,607 B2 | 2/2005 | Achuthan et al. | |
| 6,964,923 B1 | 11/2005 | Ronay | |
| 6,982,464 B2 | 1/2006 | Achuthan et al. | |
| 7,029,509 B2 | 4/2006 | Kim et al. | |
| 7,071,105 B2 | 7/2006 | Carter et al. | |
| 7,091,164 B2 | 8/2006 | Srinivasan et al. | |
| 7,125,321 B2 | 10/2006 | Prince et al. | |
| 7,125,776 B2 | 10/2006 | Achuthan et al. | |
| 7,166,506 B2 | 1/2007 | Prince et al. | |
| 7,217,989 B2 | 5/2007 | Hiramitsu et al. | |
| 7,271,088 B2 | 9/2007 | Jung et al. | |
| 8,058,175 B2 * | 11/2011 | Huang et al. | 438/697 |
| 2007/0190771 A1 * | 8/2007 | Bailey et al. | 438/597 |
| 2008/0045014 A1 | 2/2008 | Chen et al. | |
| 2008/0305610 A1 | 12/2008 | Chen et al. | |
| 2009/0057769 A1 | 3/2009 | Wei et al. | |
| 2009/0087974 A1 | 4/2009 | Waite et al. | |
| 2010/0048007 A1 | 2/2010 | Lee et al. | |
| 2010/0059823 A1 | 3/2010 | Chung et al. | |
| 2010/0062577 A1 | 3/2010 | Liao et al. | |
| 2010/0144149 A1 * | 6/2010 | Ward et al. | 438/693 |
| 2012/0068347 A1 * | 3/2012 | Isobayashi et al. | 257/773 |

FOREIGN PATENT DOCUMENTS

| | | |
|---|---|---|
| KR | 20080084293 A | 9/2008 |
| KR | 20080101454 A | 11/2008 |
| KR | 20090026984 A | 3/2009 |
| KR | 20090038141 A | 4/2009 |

OTHER PUBLICATIONS

Arnaud, F., et al. "32NM General Purpose Bulk CMOS Technology for High Performance Applications at Low Voltage" IEDM Technical Digest, Dec. 2008. pp. 633-636.

Auth, C., et al. "45NM High-K + Metal Gate Strain-Enhanced Transistors" 2008 Symposium on VLSI Technology Digest of Technical Papers. 2008. pp. 128-129.

Blumenstock, K., et al. "Shallow Trench Isloation for Ultra-Large-Scale Integrated Devices" J. Vac. Sci. Technol. B 12(1). Jan.-Feb. 1994. pp. 54-58.

Boning, D., et al. "Nanotopography Issues in Shallow Trench Isolation CMP" Material Research Society (MRS) Bulletin. Oct. 2002. pp. 761-765.

Boyd, J., et al. "A One-Step Shallow Trench Global Planarization Process Using Chemical Mechanical Polishing" Journal of the Electrochemical Society, vol. 144, No. 5. May 1997. pp. 1838-1841.

Bu, K., et al. "Selective Chemical Mechanical Polishing Using Surfactants" Journal of the Electrochemical Society, vol. 154, Issue 7. May 2007. pp. 631-635.

Chau, R. "Advanced Metal Gate/High-K Dielectric Stacks for High-Performance CMOS Transistors" Proceedings of the American Vacuum Society 5th International Conference on Microelectronics and Interfaces (ICMI). Mar. 2004. (3 Pages).

Chau, R., et al. "30NM Physical Gate Length CMOS Transistors With 1.0 PS N-MOS and 1.7 PS P-MOS Gate Delays" 2000 International Electron Devices Meeting, Dec. 2000. pp. 45-48.

Chau, R., et al. "High-K/Metal-Gate Stack and Its MOSFET Characteristics" IEEE Electron Device Letters, vol. 25, No. 6. Jun. 2004. pp. 408-410.

Choi, J., et al. "Chip Scale Prediction of Nitride Erosion in High Selectivity STI CMP" Proceedings of 2006 CMP-MIC. Feb. 2006. (10 Pages).

Choi, J., et al. "Chip Scale Topography Evolution Model for CMP Process Optimization" Proc. 2005 IEEE International Symposium on Semiconductor Manufacturing, IEEE. Sep. 2005. (6 Pages).

Choi, K., et al. "Extremely Scaled Gate-First High-K/Metal Gate Stack With EOT of 0.55 nm Using Novel Interfacial Layer Scavenging Techniques for 22nm Technology Node and Beyond" 2009 Symposium on VLSI Technology Digest of Technical Papers. Jun. 2009. pp. 138-139.

Colinge, J. "FINFETs and Other Multi-Gate Transistors" Integrated Circuits and Systems. Nov. 2007. (5 Pages).

Cummings, J., et al. "A Comparative Study of Ceria-Based and Silica-Based Slurries for 32nm Shallow Trench Isolation Chemical Mechanical Planarization" Thirteenth International C.M.P. Planarization for ULSI Multilevel Interconnection Conference. Mar. 2008. (8 Pages).

Davari, B., et al. "A New Planarization Technique, Using a Combination of Rie and Chemical Mechanical Polish (CMP)" Electron Devices Meeting, 1989. IEDM '89. Technical Digest., International. Dec. 1989. pp. 61-64.

Haensch, W., et al. "Silicon CMOS Devices Beyond Scaling" IBM Journal of Research and Development, vol. 50, No. 4/5. Jul.-Sep. 2006. pp. 339-361A.

Harris, H., et al. "Band-Engineered Low PMOS VT With High-K/Metal Gates Featured in a Dual Channel CMOS Integration Scheme" 2007 Symposium on VLSI Technology Digest of Technical Papers. Jun. 2007. pp. 154-155.

Ishihara, T., et al. "Universal Mobility Modeling and Its Application to Interface Engineering for Highly Scaled MOSFETS Based on First-Principles Calculation" 2009 IEEE. International Electron Devices Meeting, IEDM '09. Dec. 2009. pp. 75-78.

Kahng, A., et al. "Fill for Shallow Trench Isolation CMP" 2006 International Conference on Computer-Aided Design (ICCAD'06). Nov. 2006. (8 Pages).

Kaneko, A., et al. "Sidewall Transfer Process and Selective Gate Sidewall Spacer Formation Technology for Sub-15nm FINFET With Elevated Source/Drain Extension" IEEE International Electron Devices Meeting (IEDM 2005). Dec. 2005. (4 Pages).

Kotlyar, R., et al. "Inversion Mobility and Gate Leakage in High-K/Metal Gate MOSFETs" IEEE International Electron Devices Meeting (IEDM 2004). Dec. 2004. pp. 391-394.

Lai, C., et al. "A Novel 'Hybrid' High-K/Metal Gate Process for 28NM High Performance CMOSFETs" IEEE International Electron Devices Meeting (IEDM 2009). Dec. 2009. pp. 655-658.

Lee, B. "Modeling of Chemical Mechanical Polishing for Shallow Trench Isolation" Massachusetts Institute of Technology: Department of Electrical Engineering and Computer Science. Thesis Paper. May 2002. (201 Pages).

Lee, B., et al. "Using Smart Dummy Fill and Selective Reverse Etchback for Pattern Density Equalization" Proc. CMP-MIC. Feb.-Mar. 2000. pp. 255-258.

Mistry, K., et al. "A 45nm Logic Technology With High-K+Metal Gate Transistors, Strained Silicon, 9 CU Interconnect Layers, 193 nm Dry Patterning, and 100% PB-Free Packaging" IEEE International Electron Devices Meeting (IEDM 2007). Dec. 2007. (4 Pages).

Pan, J., et al. "Planarization and Integration of Shallow Trench Isolation" 1998 VMIC. VLSI Multilevel Interconnect Conference. Jun. 1998. pp. 1-6.

Prasad, Y., et al. "Role of Amino-Acid Adsorption on Silica and Silicon Nitride Surfaces During STI CMP" Electrochemical and Solid-State Letters, vol. 9, Issue 12. Sep. 2006. pp. 337-339.

Ranade, R., et al. "High Performance 35nm Lgate CMOS Transistors Featuring NISI Metal Gate (FUSI), Uniaxial Strained Silicon Channels and 1.2nm Gate Oxide" IEEE International Electron Devices Meeting (IEDM 2005). Dec. 2005. (4 Pages).

Romer, A., et al. "STI CMP Using Fixed Abrasive Demands, Measurement Methods and Results" CMP-MIC, Mar. 2000. (10 Pages).

Schlueter, J. "Trench Warfare: CMP and Shallow Trench Isolation" Semiconductor International. Oct. 1999. (5 Pages).

Steigerwald, J. "Chemical Mechanical Polish: The Enabling Technology" IEEE International Electron Devices Meeting (IEDM 2008). Dec. 2008. pp. 37-39.

Takahashi, H., et al. "Interaction Between Ultrafine Ceria Particles and Glycine" Journal of Ceramic Processing Research. vol. 5, No. 1. 2004. pp. 25-29.

Tomimatsu, T., et al. "Cost Effective 28-nm LSTP CMOS Using Gate-First Metal Gate/High-K Technology" 2009 Symposium on VLSI Technology Digest for Technical Papers. Jun. 2009. pp. 36-37.

Veera, R., et al. "Selective Chemical Mechanical Polishing of Silicon Dioxide Over Silicon Nitride for Shallow Trench Isolation Using Ceria Slurries" Journal of The Electrochemical Society. vol. 156, Issue 12. Oct. 2009. pp. 936-943.

Vo, T., et al. "Improved Planarization for STI With Fixed Abrasive Technology" Solid State Technology. Jun. 2000. (7 Pages).

Xie, X., et al. "Integrated Modeling of Nanotopography Impact in Patterned STI CMP" Microsystems Technology Laboratories. ULSI Multilevel Interconnect Conference. Feb. 2003. pp. 1-23. http://www-mtl.mit.edu/researchgroups/Metrology/PAPERS/CMPMIC-nanomodel-talk-feb2003.pdf.

* cited by examiner

CHEMICAL MECHANICAL PLANARIZATION WITH OVERBURDEN MASK

RELATED APPLICATION INFORMATION

This application claims priority to U.S. Provisional Ser. No. 61/389,546 filed on Oct. 4, 2010, incorporated herein by reference in its entirety.

This application is related to commonly assigned applications: "SHALLOW TRENCH ISOLATION CHEMICAL MECHANICAL PLANARIZATION", Ser. No. 13/012,142, filed concurrently herewith; "CHEMICAL MECHANICAL PLANARIZATION PROCESSES FOR FABRICATION OF FINFET DEVICES", Ser. No. 13/012,836, filed concurrently herewith; and "FABRICATION OF REPLACEMENT METAL GATE DEVICES", Ser. No. 13/012,879, filed concurrently herewith, all incorporated herein by reference.

TECHNICAL FIELD

The present invention relates to semiconductor fabrication and more particularly to systems and methods for chemical mechanical planarization (CMP) using an overburden mask to achieve higher planarity.

RELATED ART

Shallow trench isolation (STI) chemical mechanical planarization (CMP) is a process technology that enables the fabrication of advanced microprocessor chips. Current STI planarization processes involve the use of ceria/surfactant slurry polish followed by a fixed abrasive polish. There are several problems with this method. The ceria/surfactant system exhibits an unstable polish rate problem that contributes to significant variability in the final topography. The fixed abrasive process step is expensive and has high defect counts due to micro scratching. Furthermore, for 22 nm technology nodes and beyond, the planarity requirements are very stringent (<10 nm) for devices with high k metal gate transistors and these planarity requirements are difficult to achieve by conventional CMP processes.

Irrespective of the polish process and the slurry systems used, the observed non-planarity is around 200 to 300 Å for most designs, with large STI features recessed with respect to the active area. For 32 nm technology node and beyond, less than 100 Å final topography may be required to achieve better SRAM yields. The importance of controlling the with-in-die (WID) thickness variations and with-in-wafer (WIW) uniformity in STI polish has been emphasized for future devices. It may be difficult to meet these requirements by improved slurry chemistry alone. Other approaches may also become necessary to achieve the high levels of planarity needed for the performance of future devices.

SUMMARY

Planarization methods include depositing a mask material on top of an overburden layer on a semiconductor wafer. The mask material is planarized to remove the mask material from up areas of the overburden layer to expose the overburden layer without removing the mask material from down areas. The exposed overburden layer is wet etched and leaves a thickness remaining over an underlying layer. Remaining portions of the mask layer and the exposed portions of the overburden layer are planarized to expose the underlying layer.

A planarization method includes depositing a mask material on top of an overburden layer on a semiconductor wafer; planarizing the mask material to remove the mask material from up areas of the overburden layer to expose the overburden layer without removing the mask material from down areas; wet etching the exposed overburden layer leaving a thickness over an underlying layer; wet etching the mask material to remove the mask material from the down areas; and performing a touch up planarization to further improve a final planarity, obtain a defect free, smooth surface and expose the underlying layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
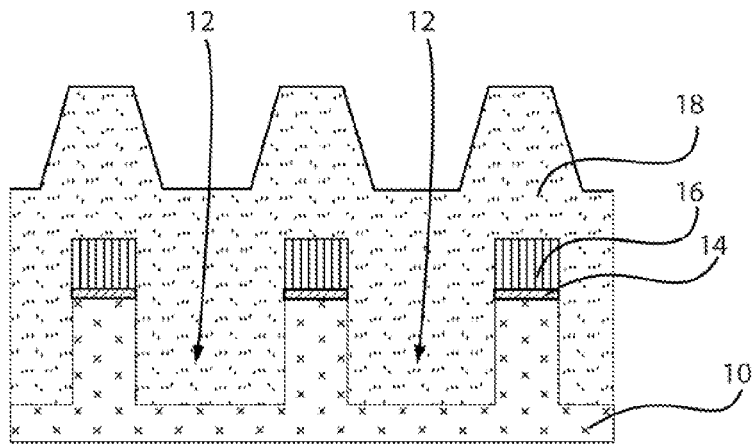
FIGS. 1A-1F are schematic diagrams showing cross-sectional views of a semiconductor device to illustrate a shallow trench isolation (STI) chemical mechanical planarization (CMP) process in accordance with the present principles.
Figure 1B:
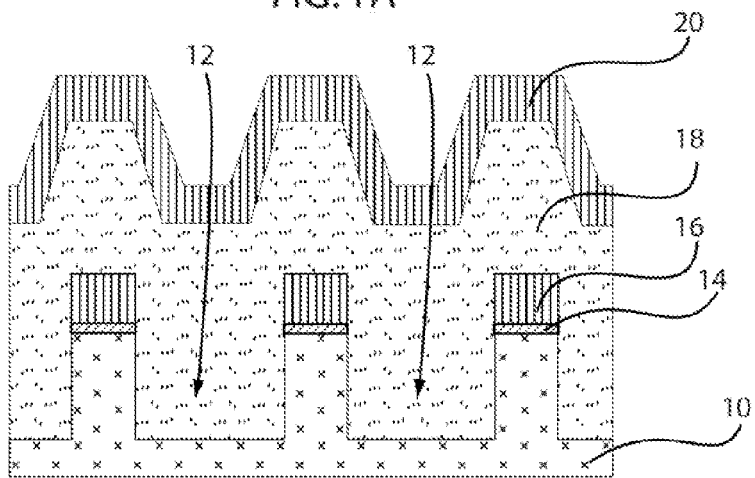
Figure 1C:
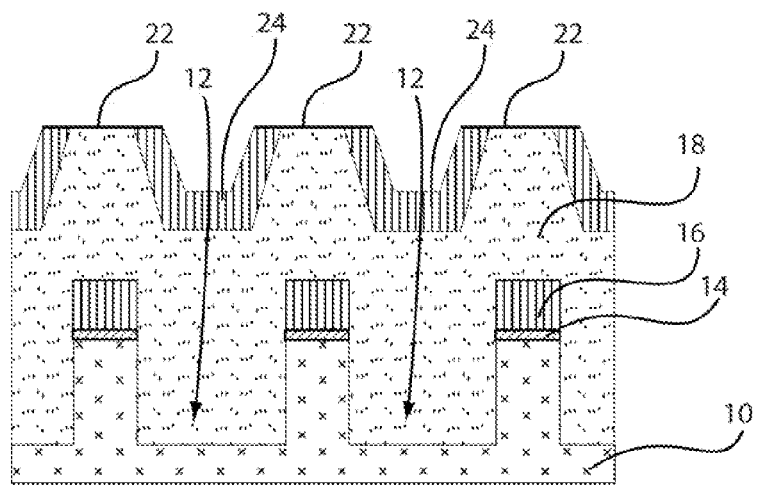

In accordance with the present principles, methods for planarization of semiconductor structures, such as, e.g., shallow trench isolation (STI) structures are described. An overburden mask is deposited over a dielectric overburden layer. Top positions of the mask layer are removed by polishing. Next, a wet etch removes an underlying layer below the overburden mask. Then, another polishing process is performed which results in a highly planar surface.

In one embodiment, a nitride mask is created not by lithography but by a blanket deposition of a nitride layer, and then the nitride layer is selectively removed from "up" areas by chemical mechanical planarization/polishing (CMP). Slurries that have high selectivity towards nitride and/or a nitride to oxide selectivity ~1:1 are preferred. A bulk of oxide overburden is removed by wet etching in the presence of the nitride mask. A next step is to remove the top nitride layers by CMP or by wet etching. A final touch up polish with about a 1:1 nitride to oxide selectivity slurry completes the planarization process. Excellent planarity is observed in STI structures planarized with this method. The slurry compositions employed for this process are also disclosed.

The flowchart and block diagrams in the Figures may, in some alternative implementations, occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of given illustrative architectures; however, other architectures, structures, substrate materials and process features and steps may be varied within the scope of the present invention. Throughout this disclosure oxide, nitride and polysilicon materials are described. However, these materials are illustrative and other materials are also contemplated and within the scope of the invention. In addition, thickness dimensions are described throughout this disclosure. These thickness dimensions are illustrative and other dimensions may be employed in accordance with the present principles.

Devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1A-1F, cross-sectional views of a CMP process are shown in accordance with one illustrative embodiment. This process uses slurries that are capable of providing different polish rates for a top layer and an underlying layer which can be varied to achieve highly planar post polish surfaces.

For purposes of explanation, a top layer of oxide and an underlying layer of nitride will be described. These materials represent a commonly employed pair of materials and are particularly useful in shallow trench isolation fabrication processes. Other materials and pairs of materials may also be employed. Slurry compositions for an STI CMP process will also be illustratively described.

Initially, a semiconductor substrate 10 has trenches 12 formed therein to be employed in forming shallow trench isolation. The trenches 12 are etched into substrate 10 by forming and patterning a photoresist mask and additional layers which may include a pad oxide 14 and a pad nitride 16. In FIG. 1A, an overburdened top layer (e.g., oxide) 18 may include, e.g., tetraethyl orthosilicate (TEOS), high density plasma (HDP) oxide, high-aspect-ratio process (HARP) oxide, etc. is deposited in the trenches 12 and over the pad nitride 16. It should be understood that other structures may be employed.

One goal is to create a highly planar STI structure after CMP. This is accomplished by reducing the dishing and erosion associated with the CMP process by forming a nitride mask 20 for an STI CMP process in FIG. 1B. The nitride mask 20 may have a thickness of between about 400 to 700 Å of silicon nitride, which is deposited on top of the layer 18 (e.g., oxide) in an STI structure. An amount of nitride 20 needed depends on the initial topography and the thickness of the oxide overburden of layer 18. This nitride 20 is then polished off to expose the underlying oxide structures in "up" areas 22 of a pattern in FIG. 1C. No significant amount of nitride in the "down" areas 24 should be removed during this CMP process. A nitride selective slurry with a high polish rate for nitride and near zero polish rate for oxide can be used during this step. Alternatively, a slurry with an approximate 1:1 nitride to oxide selectivity can also be employed. It is preferable to ensure that all the nitride 20 from the "up" areas 22 is removed during this CMP step.

Figure 1D:
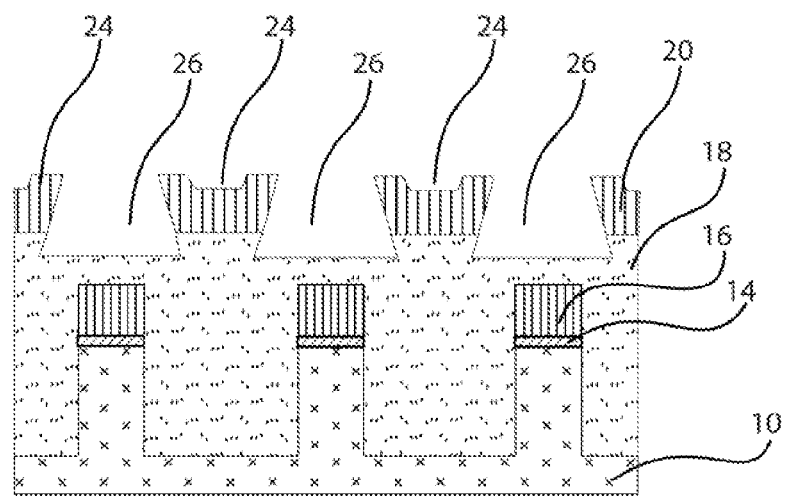
Figure 1E:
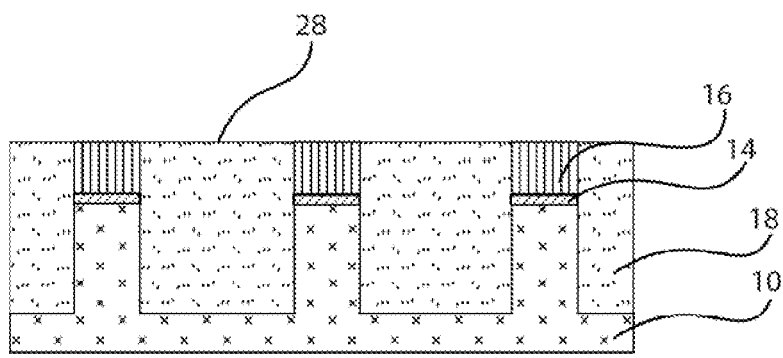
Figure 1F:
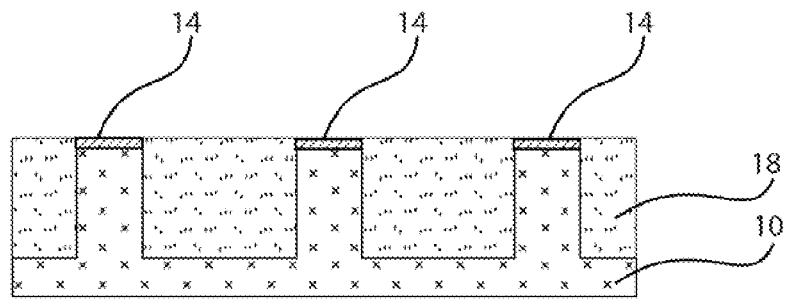

In FIG. 1D, a next step is to etch the oxide 18 from exposed areas 22 to form open areas 26 in the oxide below the nitride 20. A wet etch with a dilute solution of buffered HF can be used for this purpose. Only about 70 to 80% of the oxide is removed by wet etching leaving about 100 to 300 Å of oxide 18 above pad nitride 16. This is followed by a CMP step with a nitride selective slurry or a slurry with approximately 1:1 selectivity to complete a final planarization and form surface 28 in FIG. 1E.

Alternatively, the nitride 24 can also be removed by a hot phosphoric acid wet etch. An oxide 18 touch up polish is used to smooth the surface and remove any surface blemishes. This is followed by the usual buffered HF etch (deglaze) and nitride strip steps to remove the pad nitride 16 in FIG. 1F.

Composition of the Nitride Selective Slurry:

The slurry according to one embodiment includes: i) Abrasive 5 to 10 W %, ii) Acid 0.1 to 10 g/L, iii) pH in the range of 2 to 5 adjusted with KOH and/or $NH_4OH$. In another embodiment the slurry includes i) 5 to 10 W % of colloidal silica abrasive, ii) 0.1 to 10 g/L of phosphoric acid, iii) 0.1 to 15 g/L of citric acid, iv) pH in the range of 2 to 5 adjusted with KOH and/or $NH_4OH$.

Slurry Components: a) Abrasives: The abrasive may be at least one type of abrasive selected from inorganic and organic particles. Examples of the inorganic particles may include silica, alumina, titania, zirconia, ceria, and the like. Examples of the silica abrasives may include fumed silica, silica synthesized by sol-gel methods, colloidal silica, and the like. The fumed silica may be obtained by reacting silicon tetrachloride or other compounds of silicon, with oxygen and water in a gaseous phase. The silica synthesized by the sol-gel methods may be obtained by hydrolysis and/or condensation of an alkoxysilicon compounds as a raw materials. The precipitated colloidal silica may be obtained by an inorganic colloid method using raw materials purified in advance. Commercially available monodispersed, spherical colloidal silica slurries are suitable for this purpose.

Examples of the organic particles may include polyvinyl chloride, styrene (co)polymers, polyacetal, polyester, polyamide, polycarbonate, olefin (co)polymers, phenoxy resins, acrylic (co)polymers, and the like. Examples of the olefin (co)polymers include polyethylene, polypropylene, poly-1-butene, poly-4-methyl-1-pentene, and the like. Examples of the acrylic (co)polymers include polymethyl methacrylate polymers, copolymers, and the like. An average particle diameter of the abrasive may be 5 to 500 nm, preferably in the range 10 to 200 nm. Appropriate polishing rates can be achieved by using the abrasive particles mentioned above having an average particle diameter within this range. Combinations of one or more of the inorganic and/or organic abrasives may also be employed to achieve desired results.

b) Acids: Organic and inorganic acids may be employed to increase nitride polish rates (accelerators) and decrease oxide polish rates (inhibitors). Examples of the inorganic acids may include nitric acid, sulfuric acid, phosphoric acid and the like. Use of phosphoric acid is preferred. Various organic acids such as monobasic acids (e.g., monocarboxylic acid), dibasic acids (e.g., dicarboxylic acid), polybasic acids (e.g., polycarboxylic acid), substituted acids (hydroxyl, amino groups) may be employed. Examples of such organic acids may include saturated acids, unsaturated acids, aromatic acids and aliphatic acids, and the like. Examples of the saturated acid may include formic acid, acetic acid, butyric acid, oxalic acid, malonic acid, succinic acid, glutaric acid, adipic acid, and the like. Examples of the carboxylic acids with hydroxyl groups may include lactic acid, malic acid, tartaric acid, citric acid, and the like. Examples of the unsaturated acid may include maleic acid, fumaric acid, and the like. Examples of the aromatic acid may include benzoic acid, phthalic acid, and the like. It is preferable to use an organic acid having two or more carboxylic acid groups to obtain high polish rates of nitride. Potassium salt or ammonium salt of these acids can also be used in the pH range of 2 to 5.

The present principles including the functions of the components of the slurry are further described below by way of examples. Note that the invention is not limited to the following examples. Examples 1-2 may illustratively be employed in accordance with the present principles. It should be understood that other slurries and etching processes in accordance with the present principles may be employed other then those presented in the examples.

Example 1, a slurry for polishing nitride selective to oxide includes:
  i. 5 to 10 W % of colloidal silica abrasive,
  ii. 0.1 to 10 g/L of phosphoric acid, and
  iii. pH in the range of 2 to 5 adjusted with KOH and/or $NH_4OH$.

Example 2, another slurry for polishing nitride selective to oxide includes:
  i. 5 to 10 (W %) of colloidal silica abrasive,
  ii. 0.1 to 10 g/L of phosphoric acid,
  iii. 0.1 to 15 g/L of citric acid, and
  iv. pH in the range of 2 to 5 adjusted with KOH and/or $NH_4OH$.

Figure 2:
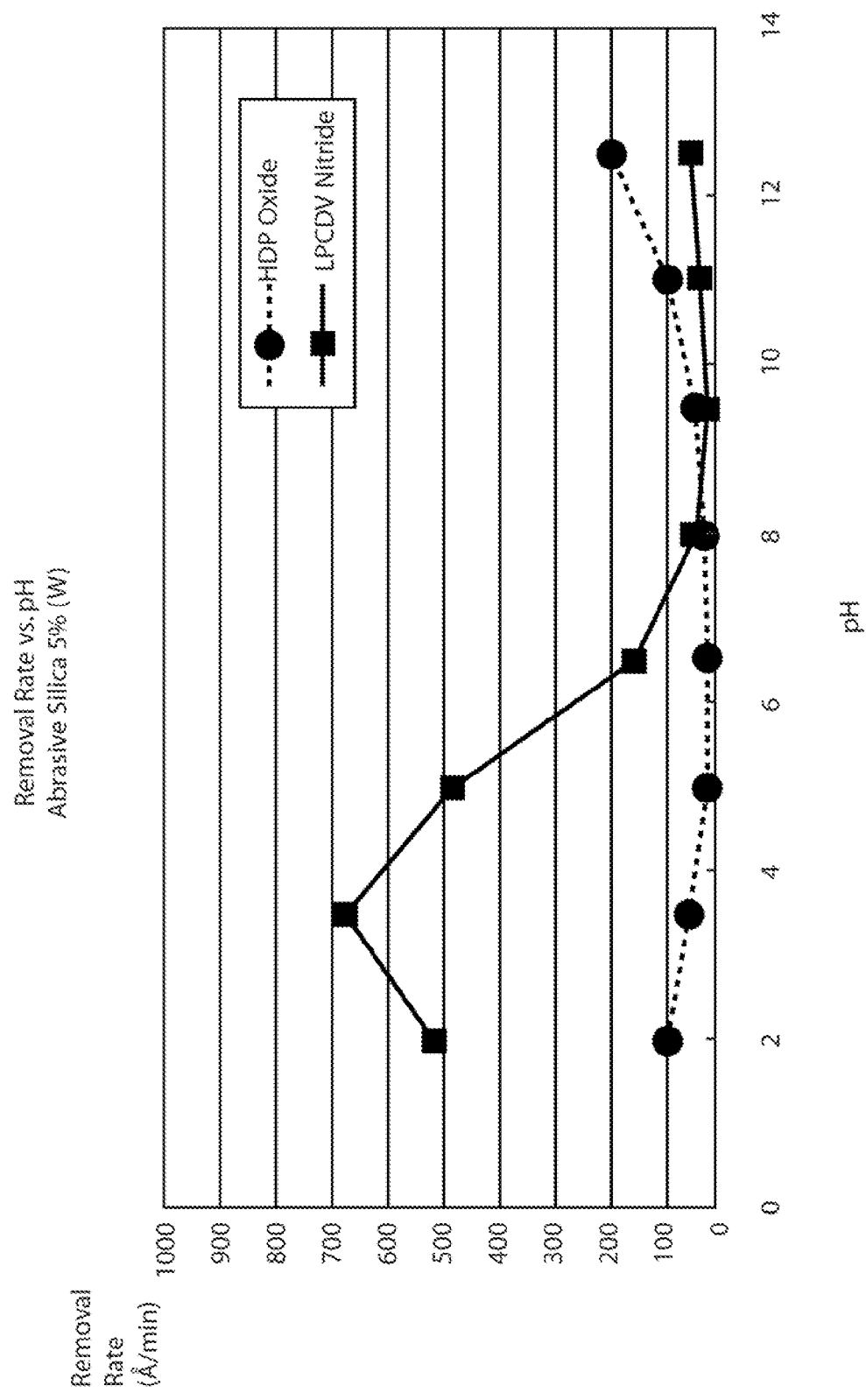
FIG. 2 is a plot showing an effect of pH on polish rates of oxide and nitride by adjusting the pH with phosphoric acid and KOH.

Referring to FIG. 2, a plot shows removal rate (Å/min) versus pH for a 5% abrasive silicon slurry. This slurry has a higher nitride removal rate than oxide removal rate in a pH range 2 to 5. One advantage of the method of FIG. 1 is that the method transfers non-uniformities associated with the nitride CMP processes to a thickness variation in a top sacrificial nitride layer (20). Since this nitride layer 20 acts only as a mask during the wet etching of oxide layers 18, the variation in its thickness does not affect the final planarity. The final touch up polish (FIG. 1E) can introduce some small amount of pattern dependent topography. To minimize this, polishing should be kept to a minimum. To reduce this even further, the nitride 24 (FIG. 1D) can be wet etched with hot phosphoric acid and eliminate the final touch up polish (FIG. 1E), if desired.

The silicon nitride layer 20 may be replaced by one of many materials that can be used as a mask. For example, TiN, TaN, silicon carbide, diamond like carbon, carbon doped silicon, polymer layers such as PMMA, polyimide, polystyrene and photo resists, carbon doped oxide such as SiCOH, OMCTS, and a variety of other materials may be used as the mask layer 20.

A test structure was employed for the evaluation of the nitride mask STI CMP process. A first structure, called a house structure, included 100 μm wide features that are covered with nitride. Another structure called a dishing macro had 130 μm wide structures that were completely filled with oxide. These two extremes were chosen to illustrate the effectiveness of the present principles.

A post CMP topography was achieved in the house structures by 1) a STI CMP process and 2) the nitride mask process in accordance with the present principles. The nitride in the house structure was recessed by ~140 Å for the conventional CMP process with a ceria/surfactant system. For the nitride mask STI CMP process in accordance with the present principles, no significant loss of nitride was observed.

A post CMP topography was achieved in the dishing macro structures by 1) the conventional STI CMP process and 2) the nitride mask process in accordance with the present principles. The oxide in the dishing macro structure was recessed by ~600 Å for the conventional CMP process with ceria/surfactant system. For the nitride mask STI CMP process in accordance with the present principles, no significant oxide recess was observed. The oxide in the macro was nearly planar with the field surrounding the structure.

Figure 3:
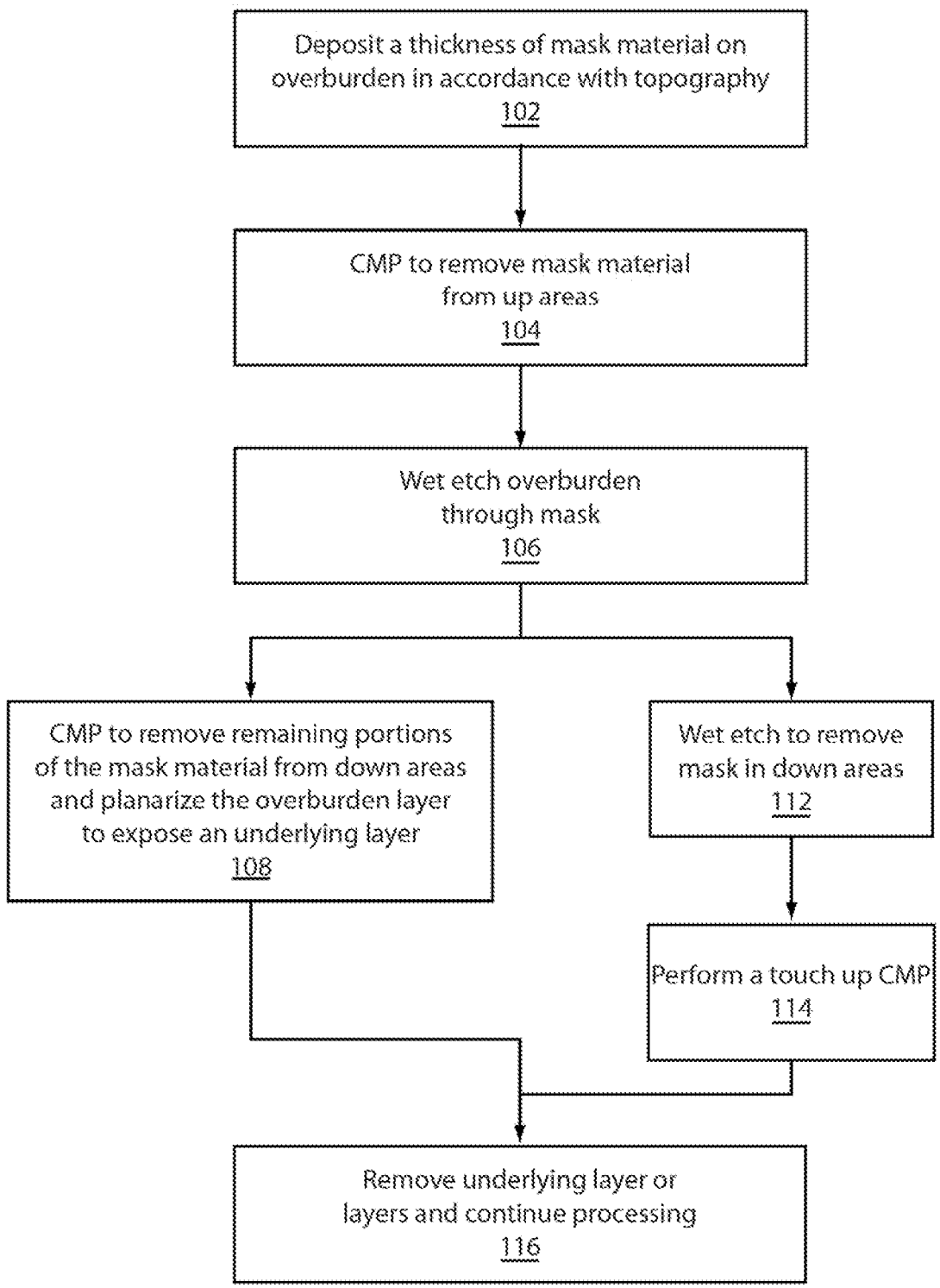
FIG. 3 is a flow chart showing an illustrative method in accordance with the present principles.

Referring to FIG. 3, a method for the chemical mechanical planarization of semiconductor wafer structures, e.g., shallow trench isolation structures, employs the following steps. In block 102, a mask material is deposited on top of an overburden layer. The overburden layer may include an oxide layer employed in forming STI structures. The mask material may include a nitride or other material such that the overburden layer can be selectively etched relative to the mask layer. The mask materials may include but are not limited to, e.g., SiN, TiN, TaN, silicon carbide, diamond like carbon, polymers such as poly methyl methacrylic acid, polyamides, polystyrene, and carbon doped oxides such as SiCOH and OMCTS (Octamethylcyclotetrasiloxane). A preferred mask material includes silicon nitride. The thickness of the mask layer depends on the topography that needs to be planarized. This may vary from about 400 to 800 Å, although other thicknesses may be employed. The mask materials may be deposited by a plasma deposition process such as rapid thermal chemical vapor deposition (RTCVD), low pressure CVD (LPCVD), atomic layer deposition (ALD), etc. The mask materials may be deposited by various spin coating methods.

In block 104, a chemical mechanical planarization (CMP) process is employed to remove the mask layer from "up" areas (e.g., peaks) without removing significant amounts of mask material from "down" areas by the use of hard polishing pads such as an industry standard IC-1000 pad or equivalent. The slurry used in the CMP may include a very high selectivity (e.g., 100:1) towards nitride in comparison to oxide, or the slurry used may have a selectivity of 1:1 to 2:1 towards nitride in comparison to oxide. The CMP step is to completely remove all the nitride from the "up" areas using a hard polish pad in conjunction with the high selectivity slurry and/or 1:1 to 2:1 nitride to oxide selectivity.

In block 106, a wet etch is employed to remove exposed portions of the overburden layer (e.g., oxide) leaving about 200 to 300 Å of material remaining over an underlying layer or structure. For the wet etch process, the etching solution may include a dilute buffered HF (BHF) in the ratio of 1:10 to 1:1000 of (BHF) with water.

In block 108, a chemical mechanical planarization process is employed to remove the remaining portions of the mask layer and to planarize the overburden layer to expose the underlying layer (e.g., nitride) covered surfaces. The slurries for blocks 104 and 108 provide, e.g., a very high polish rate for nitride and a low polish rate for oxide and may include, e.g., 5 to 10 W % of colloidal silica abrasive, 0.1 to 10 g/L of phosphoric acid, pH in the range of 2 to 5 adjusted with KOH and/or $NH_4OH$. The slurry with a selectivity of ~1:1 or 2:1 may include, e.g., 5 to 10 W % of colloidal silica abrasive, 0.1 to 10 g/L of phosphoric acid, 0.1 to 15 g/L of citric acid, pH in the range of 2 to 5 adjusted with KOH and/or $NH_4OH$. These slurries may be used as a single mix or a two part system depending on the desired outcome.

The mask and overburden layers or structures may be removed by etching or planarization. The etching embodiments may include the following. From block 106, the wet etch is performed to remove the exposed overburden layer (e.g., oxide) leaving a thickness of, e.g., about 200 to 300 Å remaining over the underlying layer. In block 112, wet etching is performed to remove the mask layer (e.g., nitride) in down areas by, e.g., a hot phosphoric acid etch In block 114, a touch up CMP may be performed to further improve final planarity and obtain a defect free, smooth oxide and nitride surface. The slurry for the additional touch up CMP to improve planarity and obtain a defect free, smooth oxide and nitride surface can be a 1:1 to 2:1 nitride to oxide selectivity slurry or another oxide CMP slurry.

In block 116, the underlying layers or structures may be removed by etching or planarization. The underlying structures may include a mask layer or layers, such as a pad nitride layer and/or a pad oxide layer. The portions of the overburden materials may be formed in trenches in a substrate, e.g., to form STI structures. Processing can continue to complete chip fabrication.

Having described preferred embodiments for chemical mechanical planarization with an overburden mask (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A planarization method, comprising:
depositing a mask material on top of an overburden layer on a semiconductor wafer;
planarizing the mask material to remove the mask material from up areas of the overburden layer to expose the overburden layer without removing the mask material from down areas;
wet etching the exposed overburden layer leaving a thickness over an underlying layer; and
planarizing remaining portions of the mask layer and the exposed portions of the overburden layer to expose the underlying layer.

2. The method as recited in claim 1, wherein the mask material includes one or more of SiN, TiN, TaN, silicon carbide, diamond like carbon, a polymer and a carbon doped oxide.

3. The method as recited in claim 1, wherein depositing a mask material includes depositing a silicon nitride mask material with a thickness in a range from 400 to 800 Å depending on a topography of the overburden layer.

4. The method as recited in claim 1, wherein depositing a mask material includes depositing the mask material by a plasma deposition process.

5. The method as recited in claim 1, wherein depositing a mask material includes depositing the mask material by a spin coating process.

6. The method as recited in claim 1, wherein the mask material includes a nitride and the overburden layer includes an oxide, and wherein planarizing the mask material to remove the mask material from up areas includes employing a slurry having a selectivity greater toward nitride in comparison to oxide.

7. The method as recited in claim 1, wherein the mask material includes a nitride and the overburden layer includes an oxide, and wherein planarizing the mask material to remove the mask material from up areas includes employing a slurry having a selectivity of 100:1 or greater toward nitride in comparison to oxide.

8. The method as recited in claim 7, wherein the slurry includes 5 to 10 W % of colloidal silica abrasive, 0.1 to 10 g/L of phosphoric acid, and a pH in the range of 2 to 5 adjusted with KOH and/or $NH_4OH$.

9. The method as recited in claim 1, wherein the mask material includes a nitride and the overburden layer includes an oxide, and wherein planarizing the mask material to remove the mask material from up areas includes employing a slurry having a selectivity between about 1:1 to about 2:1 towards nitride in comparison to oxide.

10. The method as recited in claim 9, wherein the slurry includes 5 to 10 W % of colloidal silica abrasive, 0.1 to 10 g/L of phosphoric acid, 0.1 to 15 g/L of citric acid, and a pH in the range of 2 to 5 adjusted with KOH and/or $NH_4OH$.

11. The method as recited in claim 1, wherein wet etching includes an etching solution of dilute buffered HF (BHF) in a ratio of 1:10 to 1:1000 with water.

12. The method as recited in claim 1, wherein one or more of the planarizing steps employs slurries used as one of a single mix and a two part system.

13. The method as recited in claim 1, wherein the overburden layer includes an oxide and the thickness includes about 200 to 300 Å of the oxide remaining.

14. A planarization method, comprising:
depositing a mask material on top of an overburden layer on a semiconductor wafer;
planarizing the mask material to remove the mask material from up areas of the overburden layer to expose the overburden layer without removing the mask material from down areas;
wet etching the exposed overburden layer leaving a thickness over an underlying layer;
wet etching the mask material to remove the mask material from the down areas; and
performing a touch up planarization to further improve a final planarity, obtain a defect free, smooth surface and expose the underlying layer.

15. The method as recited in claim 14, wherein the mask material includes one or more of SiN, TiN, TaN, silicon carbide, diamond like carbon, a polymer and a carbon doped oxide.

16. The method as recited in claim 14, wherein depositing a mask material includes depositing a silicon nitride mask material with a thickness in a range from 400 to 800 Å depending on a topography of the overburden layer.

17. The method as recited in claim 14, wherein the mask material includes a nitride and the overburden layer includes an oxide, and wherein planarizing the mask material to remove the mask material from up areas includes employing a slurry having a selectivity greater toward nitride in comparison to oxide.

18. The method as recited in claim 14, wherein the mask material includes a nitride and the overburden layer includes an oxide, and wherein planarizing the mask material to remove the mask material from up areas includes employing a slurry having a selectivity of 100:1 or greater toward nitride in comparison to oxide.

19. The method as recited in claim 18, wherein the slurry includes 5 to 10 W % of colloidal silica abrasive, 0.1 to 10 g/L of phosphoric acid, and a pH in the range of 2 to 5 adjusted with KOH and/or $NH_4OH$.

20. The method as recited in claim 14, wherein the mask material includes a nitride and the overburden layer includes an oxide, and wherein planarizing the mask material to remove the mask material from up areas includes employing a slurry having a selectivity between about 1:1 to about 2:1 towards nitride in comparison to oxide.

21. The method as recited in claim 20, wherein the slurry includes 5 to 10 W % of colloidal silica abrasive, 0.1 to 10 g/L of phosphoric acid, 0.1 to 15 g/L of citric acid, and a pH in the range of 2 to 5 adjusted with KOH and/or $NH_4OH$.

22. The method as recited in claim 14, wherein wet etching the exposed overburden layer includes an etching solution of dilute buffered HF (BHF) in a ratio of 1:10 to 1:1000 with water.

23. The method as recited in claim 14, wherein wet etching the mask material to remove the mask material from the down areas includes performing a hot phosphoric acid silicon etch.

24. The method as recited in claim 14, wherein one or more of the planarizing steps employs slurries used as one of a single mix and a two part system.

25. The method as recited in claim 14, wherein the mask material includes a nitride and the overburden layer includes an oxide, and wherein performing a touch up planarization includes one of a 1:1 to 2:1 nitride to oxide selectivity slurry and an oxide planarization slurry.

* * * * *